United States Patent [19]

Kasai et al.

[11] Patent Number: 4,862,029
[45] Date of Patent: Aug. 29, 1989

[54] ACTUATOR

[75] Inventors: Kiyoshi Kasai; Naomichi Sakai; Tomoyuki Oikawa; Kenji Uchino, all of Kanagawa; Takaaki Tsukidate, Tokyo; Hiroshi Asakura, Kanagawa; Hiroshi Yamamura, Kanagawa; Hiroya Nagata, Kanagawa, all of Japan

[73] Assignee: Tosoh Corporation, Yamaguchi, Japan

[21] Appl. No.: 145,861

[22] Filed: Jan. 20, 1988

Related U.S. Application Data

[63] Continuation-in-part of Ser. No. 47,485, May 11, 1987, abandoned.

[30] Foreign Application Priority Data

Feb. 11, 1987 [JP] Japan ................................. 62-275732
Oct. 23, 1987 [JP] Japan ................................. 62-266486

[51] Int. Cl.$^4$ ............................................. H01L 41/18
[52] U.S. Cl. .................................... 310/311; 310/330; 310/358; 252/62.9
[58] Field of Search ......................... 310/311, 357–359, 310/330–332, 363; 252/62.9

[56] References Cited

U.S. PATENT DOCUMENTS 2,402,518  6/1946  Wainer ............................. 310/358 X
2,467,169  4/1949  Wainer ............................. 310/358 X
2,633,543  3/1953  Howatt ............................ 310/359 X Primary Examiner—Mark O. Budd
Attorney, Agent, or Firm—Nixon & Vanderhye

[57] ABSTRACT

An actuator of the present invention is composed of a monomorph-type piezoelectric ceramic. The monomorph-type piezoelectric ceramic is a BaTiO$_3$-based ceramic, a PZT based ceramic having Nb, Sb, La, Mn, Nd and Bi, BaTiO$_3$—SrTiO$_3$-based ceramic containing SrTiO$_3$ by 20 to 35 mole %, K(Nb, Ta)O$_3$-based ceramic, or a ceramic represented by a general formula: [Pb, (A$_{\frac{1}{2}}$B$_{\frac{1}{2}}$)](Zr$_{1-n}$, Cn)O$_3$ where A is a monovalent element such as Li, Na, K, Rb, Cs or the like, B is a trivalent element such as Bi, La, Y, Sb, Ga or the like, A and B being both replaceable solid-meltable elements for Pb, C is an element such as Ti, Sn or the like that is a replaceable solid-meltable element for Zr, and n is from 0 to 0.8.

12 Claims, 3 Drawing Sheets

4,862,029

ACTUATOR

CROSS REFERENCE

The present invention is a continuation-in-part application of U.S. Ser. No. 047,485 filed May 11, 1987 (now abandoned.

ACTUATOR

The present invention relates to an actuator that is useful as a drive source for positioning with precision machine, for controlling flow rates with valves, for operating fans associated with such valves, for operating fans associated with such valves, or for controlling the length of the optical path of an optical device, or as transducers in piezoelectric speakers and ultrasonic transducers. The term "actuator", as used herein, includes not only elements used to displace the objects with which they are in contact but also elements that move themselves without causing other objects to be displaced.

BACKGROUND OF THE INVENTION

Two types of elements have previously been known that make use of the deflection properties of piezoelectric ceramics; one is of the unimorph type in which a single thin layer of a poled piezoelectric ceramic material is adhered to a fixed electrode plate (shim); the other is of the bimorph type in which a thin layer of a poled ceramic is adhered to both sides of the shim.

These devices suffer from two major problems: if a high instantaneous negative voltage is applied or if negative voltages are applied for a prolonged period, either the piezoelectric ceramic material is depolarized or the adhesive between the ceramic material and the electrode material deteriorates such as to cause them to separate from each other. As a result, the life of these elements that are used as actuators is inevitably short.

The present inventors have discovered a piezoelectric ceramic material that can be described as a monomorph-type ceramic in that a single layer of this material is capable of deflecting without preliminary poling. The problems associated with the prior art can be effectively solved to a significant extent by using such monomorph-type piezoelectric ceramics as actuators.

BRIEF DESCRIPTION OF THE DRAWINGS

FIG. 2 is a graph showing the relationship between the electric field and the displacement of an actuator in a bipolar drive.

FIG. 3 is a graph showing the electric field vs displacement curves of an actuator in a unipolar drive.

FIG. 4 is a graph showing the frequency dependency of the displacement of an actuator in a unipolar drive; and FIG. 5 is a graph showing the electric field vs displacement characteristics of actuators using different electrode materials.

SUMMARY OF THE INVENTION

Figure 1:
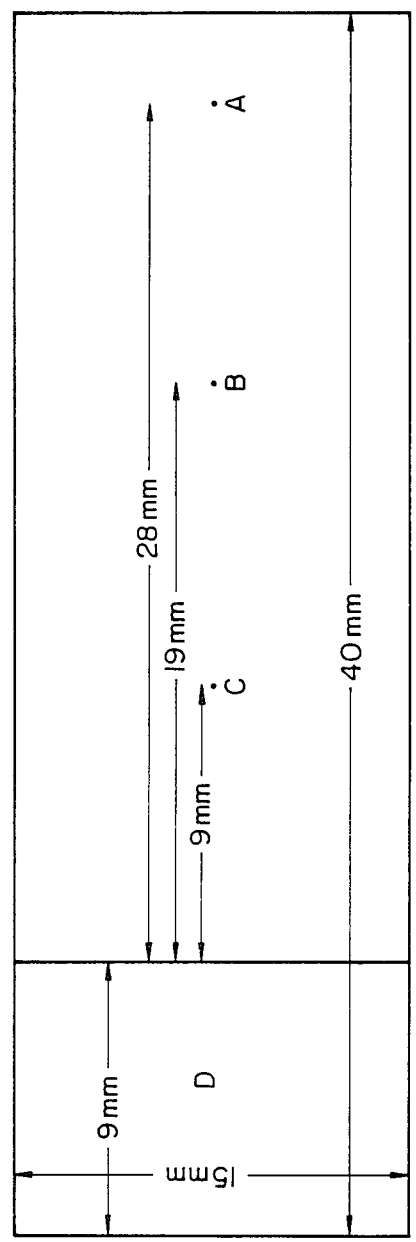
FIG. 1 is a schematic diagram of the actuators in plate form prepared in Examples 1 to 23 and Comparative Examples 1 to 7 and shows the longitudinal and transversal dimensions (in mm) of the actuator; points A, B and C are the points of deflection measurement and area D the area in which the actuator was fixed.

According to the present invention, an actuator is composed of a monomorph-type piezoelectric ceramic.

Furthermore, in the actuator of the present invention, the monomorph-type piezoelectric ceramic is a $BaTiO_3$-based ceramic that has a dielectric loss of at least 5% at 1 kHz and whose dielectric loss at 100 kHz drops by at least 30% of the value at 1 kHz that in a single layer deflects without preliminary poling.

In a first embodiment the $BaTiO_3$-based ceramic contains 0.2 to 20 mol % of $SiO_2$ or 0.2 to 1.5 mol % $Al_2O_3$ or, if both $SiO_2$ and $Al_2O_3$ are present a total amount of 0.2 to 20 mol % and a molar ratio of $Al_2O_3$ to $SiO_2$ no higher than 0.8. The ceramic may also contain at least one oxide of an 5A-group element, Ga, Bi, Sb, W or a rare-earth element.

In another embodiment a semiconducting $BaTiO_3$-based ceramic with an oxidized surface is described which, prior to oxidizing, preferably has a specific resitivity in the range of 10 to $10^6$ Ω.cm. The ceramic is composed entirely of $BaTiO_3$ or it may contain from 0.33 to 2 mol% of Bi, Sb, W or a rare-earth element.

DETAILED DESCRIPTION OF THE INVENTION

Two specific examples of the monomorph-type piezoelectric ceramic invention is made are described below.

I. Dielectric-Loss Type $BaTiO_3$-Based Ceramics

Commercial $BaTiO_3$-based ceramics which have high dielectric constants and small dielectric losses are currently used as capacitors. These kinds of ceramics are not suitable for use as actuators since they do not possess good electric field vs displacement characteristics.

Surprisingly, the present inventors have found a group of $BaTiO_3$-based ceramics that have dielectric losses of no less than 5% at 1 kHz, and whose dielectric loss at 100 kHz drops by at least 30% of the value at 1 kHz, are of the monomorph type.

For instance, $BaTiO_3$-based ceramics having these characteristics can be prepared by doping $BaTiO_3$ with a specified amount of $SiO_2$ and/or $Al_2O_3$, and optionally with at least one oxide of an element selected from among a 5A-group element, Ga, Bi, Sb, W and a rare-earth element for the purpose of supressing the growth of grains in the ceramic. Examples of $BaTiO_3$-based ceramics that are prepared in this manner include those which contain, in addition to $BaTiO_3$, 0.2–20 mol% of $SiO_2$, 0.2–1.5 mol% of $Al_2O_3$, when both $SiO_2$ and $Al_2O_3$ are present the total amount is 0.2–20 mol%, with the molar ratio of $Al_2O_3$ to $SiO_2$ being no more than 0.8, or 1–2 mol% of $SiO_2$ and/or $Al_2O_3$ in combination with about 0.33–2 mol% of an oxide of a 5A-group element, Ga, Bi, Sb, W or a rare-earth element.

II. Surface-Oxidized Type Semiconducting $BaTiO_3$-Based Ceramic

According to another observation of the present inventors, semiconductive $BaTiO_3$-based ceramics that are oxidized at their surface but which remain semiconductive in their interior are also of the monomorph type. A suitable semiconductive $BaTiO_3$-based ceramic may be selected from the known $BaTiO_3$-based ceramics having specific resistivities of $10-10^6$ Ω.cm, and they may be made entirely of $BaTiO_3$ or they may contain approximately 0.33-2 mol% of at least one oxide of an element selected from among 5A-group elements, Ga, Bi, Sb, W and rare-earth elements.

III. Other Monomorph Type Piezoelectric ceramics

The present inventors have found that, in addition to the above-described $BaTiO_3$-based ceramic, perovskite type piezoelectric ceramics having the following compositions may be used as monomorph type piezoelectric elements.

(i) A piezoelectric element comprises an unpolarized PZT based ceramic having Nb, Sb, Ta, La, Mn, Nd, Bi or the like as an additive.

(ii) A piezoelectric element comprises unpolarized $BaTiO_3$-$SrTiO_3$ based ceramic containing $SrTiO_3$ by 20 to 35 mol %.

(iii) A piezoelectric element comprises unpolarized $K$c$Nb$, $Ta)O_3$ based ceramic containing $SiO_2$ andor $Al_2O_3$. Preferably, the element contains 0.8-1.2 mol % $A_2O_3$ or $SiO_2$.

(iv) A piezoelectric element comprises an unpolarized ceramic given by a general formula: $[Pb, (A_{\frac{1}{2}}B_{\frac{1}{2}})](Zr_{1-n}, Cn)O_3$ where $A$ is a monovalent element such as Li, Na, K, Rb, Cs or the like, B is a trivalent element such as Bi, La, Y, Sb, Ga or the like, A and B being both replaceable solid-meltable elements for Pb, C is an element such as Ti, Sn or the like that is a replaceable solid-soluble element for Zr, and n is from 0 to 0.8.

MANUFACTURING METHOD OF MONOMORPH PIEZOELECTRIC ELEMENT $BaTiO_3$-based ceramics are prepared in the following manner. A $BaTiO_3$ powder suitable for use as the starting material for the preparation of either type of the $BaTiO_3$-based ceramics described above may, for example be prepared by either the solid-phase reaction methods, in which a mixture of $BaCO_3$ and $TiO_2$ powders is calcined and ground into particles, or by the "co-precipitation method", in which oxalic acid or some other appropriate precipitant is added to an aqueous solution of water-soluble salts, e.g., the nitrate and hydrochloride salts, or barium and titanium to form a precipitate which then is calcined and ground into particles.

The ceramic of which the actuator of the present invention is made may be prepared by the process that is commonly employed in the production of conventional ceramics. This process includes steps such as weighing the starting powders, mixing the weighed powders, drying the powder mixture, forming the dried powders into a predetermined shape and sintering. The starting powders may be mixed by any of the conventional methods that employ ball mills or vibration mills. The green body may be formed by any appropriate method, such as pressing with molds, molding with a rubber press, slip casting, injection molding or tape casting.

The ease with which the green body can be sintered will vary with the composition and their amounts but the $BaTiO_3$ and $BaTiO_3$-based powders described above can be sintered by holding them at temperatures of 1,200°-1,450° C. for 1-15 hours. The $BaTiO_3$-$SrTiO_3$-based materials described above can be sintered by holding them at temperatures of 1,300°-1,400° C. for 1-15 hours. The $[Pb, (A_{\frac{1}{2}}B_{\frac{1}{2}})](Zr_{1-n}, C_n)O_3$-based ceramic materials described above can be sintered by holding them at temperatures of 1,000°-1,350° C. for 1-15 hours. The $K(Nb, Ta)O_3$-based ceramic materials described above can be sintered by holding them at temperatures 1,100°-1,250° C. for 1-15 hours. Also, the PZT-based ceramic materials can be sintered by holding them at temperature of 900°-1,300° C. for 1-15 hours. Air may be used as the sintering atmosphere if $BaTiO_3$-based ceramics characterized by their dielectric loss properties are to be produced. If surface-oxidized type ceramics made entirely of $BaTiO_3$ are to be produced, an inert atmosphere such as Ar and $N_2$ or a reducing atmosphere such as $H_2$ may advantageously be used. If surface-oxidized type $BaTiO_3$-based ceramics that contain oxides of 5A-group elements, Ga, Bi, Sb, W or rare-earth elements are to be produced, sintering may be conducted either in air or in the non-oxidizing atmosphere described above.

In order to prepare surface-oxidized type $BaTiO_3$-based ceramics, sinters that preferably have specific resistivities within the range of $10$-$10^6$ $\Omega$.cm are first made by the procedures described above and then heated in air at 700 1,200° C. for a period of from 10 minutes to 3 hours to oxidize the surface.

With respect to the PZT-based ceramics, it is preferable that the amount of additive such as $Nb_2O_5$, $Sb_2O_3$, $Ta_2O_5$, $La_2O_5$, $MnO_2$, $Nd_2O_3$ or $Bi_2O_3$ be 0-2.0 mol % relative to PZT powder, prefeerably 0.8-2.0 mol %.

Also, although the preferable sintering temperatures vary depending upon the kind of the additive, it is preferable that such temperatures be temperatures at which the relative density of the sintered body is 70 to 90%. Thus, it is possible to obtain the sintered body having a small particle diameter, a large porosity and a low density. As a result, the obtained body has a high elastic compliance, that is, a mechanically high flexibility, thereby enhancing its bending displacement.

As already mentioned, the actuator of the present invention is composed of the monomorph type which is capable of deflecting even if it is in the form of a single layer of non-poled $BaTiO_3$-based ceramic. Although we do not wish to be bound by any particular theory or mode of operation, it is believed the reason why this monomorph actuator deflects may be explained as follows: when a semiconductor is joined to a metal that does not produce an Ohmic contact, a Schottky barrier (or a Mott barrier if an insulating layer is present between semiconductor and metal) is formed in the structure of an electronic energy band; if such a metal is attached to both sides of the semiconductor and a voltage is applied across the semiconductor, a current will flow in the opposite direction at the interface on the other side. According to semiconductor theory, the electric field in the ceramic is not uniform and is concentrated in the vicinity of the metal-ceramic interface at which the reverse current is flowing.

This explanation will apply not only to semiconductive ceramics but also to the case where an insulative layer is formed in the surface of a semiconductive ceramic. If this insulative layer contains electric charges, i.e., electrons or ions, that will move in an electric field, application of a voltage causes the charges to move around in the insulator so that a potential barrier is produced at the interface between electrode and ceramic on the side where the insulating layer is present. As in the first case, the resulting electric field is concentrated in the vicinity of that electrode-ceramic interface.

In this way, a nonuniform electric field develops and only the side of the ceramic plate where field concentration has occurred either expands or shrinks as a result of piezoelectricity, and the ceramic plate will undergo deflection.

The invention will be further explained with reference to the following non-limiting examples.

Examples 1-23 and Comparative Examples 1-7

In both Example 1 and Comparative Example 1, in which no additive was used, a $BaTiO_3$ powder was shaped directly into a plate (about 48 mm long×ca. 18 mm wide×ca. 10 mm thick) at a pressure of 1.5 tons/cm². In Examples 2-23 and Comparative Examples 2-7, $BaTiO_3$ powder and predetermined oxides were weighed and mixed in ethanol for 24 hours in a ball mill; the mixed powders were dried and shaped into a plate of the same dimensions as specified above and at a pressure of 1.5 tons/cm². In Example 1, the plate was sintered in argon gas at a predetermined temperature for a predetermined period. In the other examples and comparative examples, air was used as the sintering atmosphere. The sintered materials were cut through on a plane parallel to the top surface so as to make actuators each made of a ceramic plate having the dimensions of 40 mmL, 15 mmW and 0.5 mmT. In Examples 1-9, the specific resistivities of the ceramic samples were measured. Additive amounts (when present), sintering conditions and electrical properties are given in the Tables that follow.

Electrodes were formed on opposite faces of each ceramic sample by first coating a silver paste, then firing it in air at 800° C. for 1 hour. In Examples 1 to 9, the surfaces of each ceramic sample were oxidized to become completely insulating as verified by measurements of their resistance. In Examples 10 to 23 and Comparative Examples 1 to 7, the dielectric loss of each sample was measured at predetermined frequencies.

After electrodes had been attached in the manner described above, each of the actuators was placed in an electric field of 6 kV/cm, with one end being fixed over a distance of 9 mm from its edge (the fixed area being designated area D in FIG. 1). The amounts of displacement of the actuator at three points that were 28 mm, 19 mm and 9 mm distance from the fixed area (designated by points A, B and C, respectively, in FIG. 1) were measured with non-contact type sensor using an eddy current.

The results of the measurements conducted and the conditions employed in preparing the actuators are summarized in Tables 1 and 4.

When an ac voltage of 10 volts was applied to the actuators fixed in the manner described above, each of the actuators vibrated to produce sound waves having frequencies equal to those of the applied ac voltage.

EXAMPLE 24

Ceramic actuator samples having the composition 93 mol% $BaTiO_3$, 5 mol% $SiO_2$ and 2 mol% $Al_2O_3$ were prepared as in Example 1 and fixed on a jig in the manner shown in FIG. 1. The amount of displacement at point A of each sample was measured in either a bipolar or unipolar drive.

Figure 2:
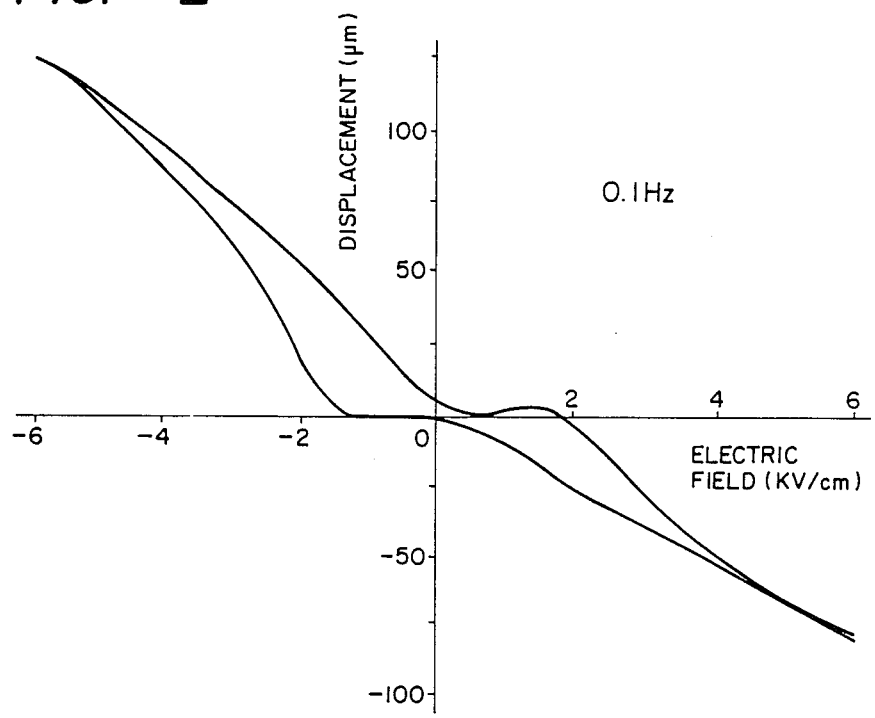
FIGS. 2 to 5 illustrate graphically the data measurements conducted in Example 24.
Figure 3:
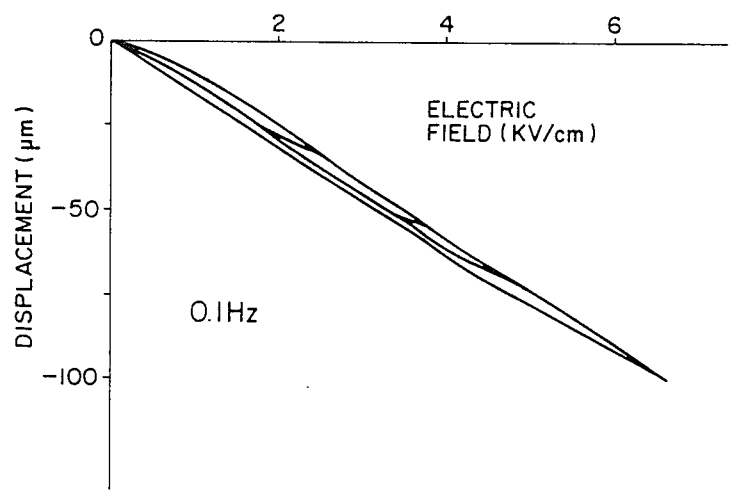
Figure 4:
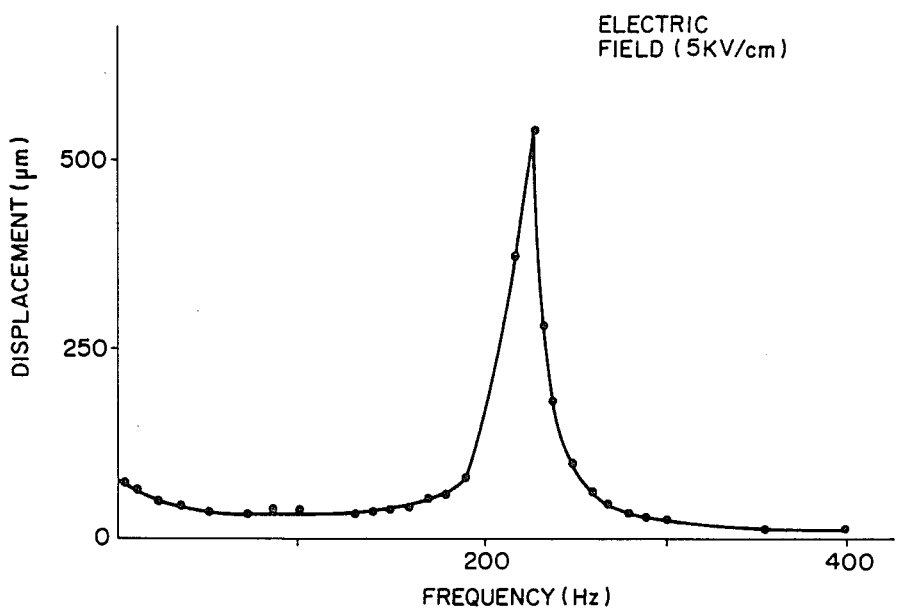

FIG. 2 is a graph showing the results of displacement measurement against electric field when the actuator was driven in a bipolar fashion by application of an ac voltage at a frequency of 0.1 Hz. In FIG. 2, the displacement that occurred in the same direction as that of electric field is indicated by a plus sign. FIG. 3 shows the field strength vs displacement characteristics of the actuator in a unipolar drive at a frequency of 0.1 Hz. The hysteresis measured from the electric field vs displacement characteristics was very small and the displacement changed substantially linearly with electric field (2.5, 3.8, 5 and 6.8 kV/cm). FIG. 4 shows the relationship between frequency and displacement of the actuators in a unipolar drive at varying frequencies. At 220 Hz, each actuator experienced a maximum displacement which caused its mechanical resonance. Clearly, the relaxation time of charge transfer was not long enough to prevent the resonance of the actuators.

Figure 5:
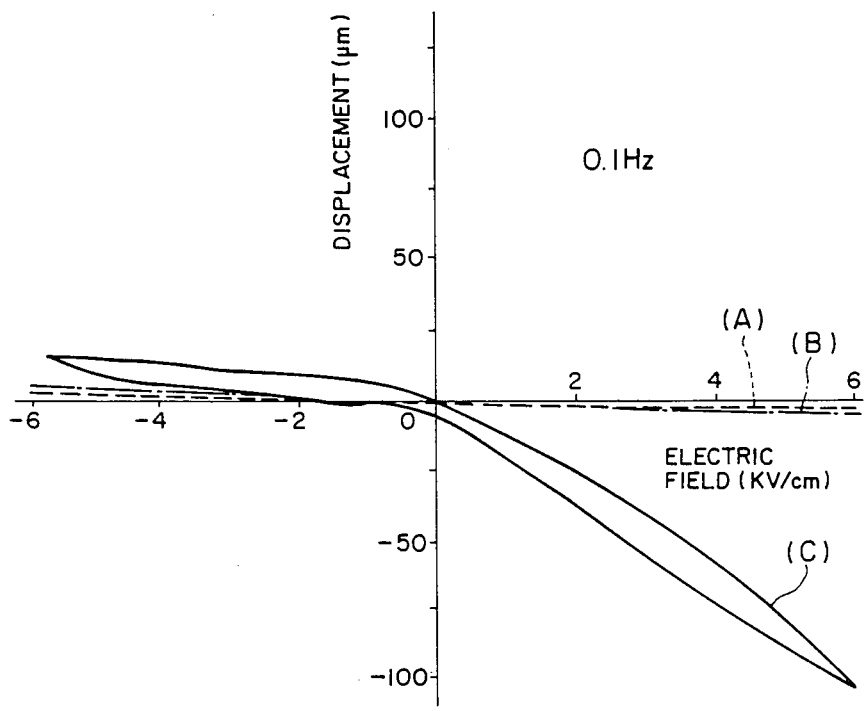

The effect of electrode type on the displacement of the actuator was evaluated by changing the electrode formed on both sides of the actuators. The results are shown in FIG. 5, where line A refers to the actuator which was coated with a Ga-In layer on both sides, line B refers to the case where a gold film was vapor-deposited on both sides of the actuator, and line C refers to the case where on side of the actuator was provided with a fired Ag layer and the other side was coated with a Ga-In layer. It is apparent that the use of fired silver electrodes is important for producing appreciable amounts of displacement in the actuator.

TABLE 1

| Example No. | Additive name | Additive amount (mol %) | Specific resistivity before oxidation (Ω·cm) | Sintering temperature (°C.) | Sintering time (hr) | Displacement (μm) A | B | C |
| --- | --- | --- | --- | --- | --- | --- | --- | --- |
| 1 | — | — | 200 | 1280 | 1 | 9 | 5 | 3 |
| 2 | $Nb_2O_5$ | 0.94 | 3000 | 1280 | 1 | 52 | 28 | 14 |
| 3 | $V_2O_5$ | 0.57 | 100 | 1320 | 1 | 56 | 30 | 12 |
| 4 | $Sb_2O_3$ | 0.48 | 60 | 1280 | 1 | 34 | 18 | 7 |
| 5 | $Bi_2O_3$ | 0.42 | 100 | 1280 | 1 | 38 | 19 | 7 |
| 6 | $HO_3$ | 0.32 | 3000 | 1280 | 1 | 24 | 13 | 10 |
| 7 | $Dy_2O_3$ | 0.18 | 9000 | 1240 | 1 | 18 | 8 | 4 |
| 8 | $Y_2O_3$ | 0.66 | 700 | 1360 | 1 | 27 | 12 | 6 |
| 9 | $Ga_2O_3$ | 1.25 | 10000 | 1320 | 1 | 11 | 5 | 3 |

TABLE 2

| | Additive name | Additive amount (mol %) | Dielectric Loss (%) 1 kHz | 10 kHz | 100 kHz | percentage drop | Sintering temp. (°C.) | Sintering time (hr) | Displacement A | B | C |
| --- | --- | --- | --- | --- | --- | --- | --- | --- | --- | --- | --- |
| Example | | | | | | | | | | | |
| 10 | $Al_2O_3$ | 0.2 | 7.8 | 7.7 | 4.3 | 44.9 | 1250 | 15 | 11 | 4 | 0 |
| 11 | $SiO_2$ | 0.5 | 11.8 | 4.6 | 2.7 | 77.1 | 1250 | 15 | 48 | 21 | 5 |
| 12 | $SiO_2$ | 1.5 | 7.4 | 3.6 | 2.4 | 67.6 | 1280 | 15 | 23 | 10 | 2 |

TABLE 2-continued

| | Additive | | Dielectric Loss (%) | | | percentage | Sintering | | Displacement | | |
|---|---|---|---|---|---|---|---|---|---|---|---|
| | name | amount (mol %) | 1 kHz | 10 kHz | 100 kHz | drop | temp. (°C.) | time (hr) | A | B | C |
| Comparative Example | | | | | | | | | | | |
| 1 | — | — | 4.4 | 4.8 | 7.1 | −61.4 | 1250 | 15 | 0 | 0 | 0 |
| 2 | Al$_2$O$_3$ | 10.0 | 2.0 | 1.8 | 1.5 | 25.0 | 1250 | 15 | 0 | 0 | 0 |
| 3 | Al$_2$O$_3$ | 2.0 | 4.1 | 2.5 | 3.2 | 22.0 | 1250 | 15 | 0 | 0 | 0 |
| 4 | SiO$_2$ | 30.0 | 1.1 | 1.3 | 2.0 | −81.8 | 1250 | 15 | 0 | 0 | 0 |

TABLE 3

| | Additive | | Dielectric Loss (%) | | | percentage of drop | Sintering | | Displacement (μm) | | |
|---|---|---|---|---|---|---|---|---|---|---|---|
| | molar ratio of Al$_2$O$_3$ to SiO$_2$ | sum of Al$_2$O$_3$ and SiO$_2$ (mol %) | 1 kHz | 10 kHz | 100 kHz | | temp. (°C.) | time (hr) | A | B | C |
| Example | | | | | | | | | | | |
| 13 | 0.2 | 2 | 0.5 | 2.4 | 1.3 | 74.0 | 1250 | 15 | 4 | 2 | 0 |
| 14 | 0.5 | 0.2 | 5.9 | 3.7 | 3.4 | 42.4 | 1250 | 15 | 14 | 6 | 1 |
| 15 | 0.5 | 5 | 16.0 | 7.0 | 3.9 | 75.6 | 1250 | 15 | 33 | 15 | 3 |
| 16 | 0.5 | 10 | 27.0 | 15.4 | 11.8 | 56.3 | 1250 | 15 | 58 | 27 | 6 |
| 17 | 0.5 | 20 | 12.9 | 6.7 | 4.3 | 60.7 | 1250 | 15 | 27 | 12 | 3 |
| 18 | 0.8 | 5 | 12.6 | 5.8 | 3.4 | 73.0 | 1250 | 15 | 9 | 4 | 1 |
| Comparative Example | | | | | | | | | | | |
| 5 | 1.0 | 0.5 | 1.6 | 1.7 | 2.5 | −50.3 | 1250 | 15 | 0 | 0 | 0 |
| 6 | 2.0 | 10 | 1.8 | 1.7 | 2.0 | −11.1 | 1250 | 15 | 0 | 0 | 0 |
| 7 | 2.0 | 5 | 2.3 | 1.9 | 2.6 | −13.0 | 1250 | 15 | 0 | 0 | 0 |

TABLE 4

| Example No. | Additive | | Another Additive | | Dielectric Loss (%) | | | Percentage of drop | Sintering | | Displacement (μm) | | |
|---|---|---|---|---|---|---|---|---|---|---|---|---|---|
| | Al$_2$O$_3$ (mol %) | SiO$_2$ (mol %) | name | amount | 1 kHz | 10 kHz | 100 kHz | | temp. (°C.) | time (hr) | A | B | C |
| 9 | — | 2 | Nb$_2$O$_5$ | 0.56 | 49.3 | 25.3 | 11.2 | 77.3 | 1250 | 1 | 37 | 17 | 4 |
| 0 | 1 | 2 | Nb$_2$O$_5$ | 0.53 | 37.4 | 19.5 | 18.8 | 49.7 | 1200 | 1 | 30 | 14 | 3 |
| 1 | — | 2 | V$_2$O$_5$ | 1.02 | 75.7 | 46.3 | 22.2 | 70.7 | 1250 | 1 | 19 | 9 | 2 |
| 2 | 1 | 1 | La$_2$O$_3$ | 0.41 | 148.2 | 53.8 | 19.8 | 86.6 | 1440 | 1 | 12 | 6 | 1 |
| 3 | — | 2 | Dy$_2$O$_3$ | 0.33 | 11.2 | 5.8 | 7.7 | 31.3 | 1250 | 1 | 24 | 11 | 2 |

*Note: The "percentage of drop" in the column of "dielectric loss" in Tables 2, 3 and 4 indicates the amount by which the dielectric loss of an activator at 100 kHz decreased from the value at 1 kHz.

We claim:

1. An actuator comprising an actuator element capable of bending in response to an applied electric field, said actuator element consisting of an unpolarized monomorph-type PZT-based piezoelectric ceramic which includes at least one additive selected from oxides of Nb, Sb, Ta, La, Mn and Bi in an amount between 0.8 to 2.0 mol% relative to the PZT powder in said PZT-based piezoelectric ceramic, and wherein said PZT-based ceramic exhibits a dielectric loss value of at least 5% at 1 kHz, and a dielectric loss value at 100 kHz which is at least 30% less than the dielectric loss value at 1 kHz.

2. The actuator according to claim 1, wherein said additive is Nb$_2$O$_5$.

3. The actuator according to claim 1, wherein said additive is Sb$_2$O$_3$.

4. The actuator according to claim 1, wherein said additive is Ta$_2$O$_5$.

5. An actuator comprising an actuator element capable of bending in response to an applied electric field, said actuator element consisting of an unpolarized monomorph-type BaTiO$_3$-SrTiO$_3$-based piezoelectric ceramic including on at least one side thereof a fired Ag layer, wherein said monomorph-type piezoelectric ceramic contains SrTiO$_3$ in an amount between 20 to 35 mol%.

6. An actuator comprising an actuator element capable of bending in response to an applied electric field, said actuator element consisting of an unpolarized monomorph-type K(Nb, Ta))$_3$-based piezoelectric ceramic, wherein said monomorph-type piezoelectric ceramic contains SiO$_2$ or Al$_2$O$_3$ as an additive.

7. The actuator according to claim 6, wherein the ceramic contains 0.8-1.2 mol % Al$_2$O$_3$ or SiO$_2$.

8. An actuator comprising an actuator element capable of bending in response to an applied electric field, said actuator element consisting of an unpolarized monomorph-type piezoelectric ceramic, wherein said monomorph-type piezoelectric ceramic is a (Pb,(A$_{\frac{1}{2}}$B$_{\frac{1}{2}}$))(Zr$_{1-n}$, C$_n$)O$_3$-based ceramic where A is a monovalent element selected from the group consisting of Li, Na, K, Rb, and Cs, B is a trivalent element selected from the group consisting of Bi, La, Y, Sb, and Ga, A and B being both replaceable solid-meltable elements for Pb, C is an element of Ti or Sn that is a replaceable solid-meltable element for Zr, and n is from 0 to 0.8.

9. The actuator according to claim 8, wherein said ceramic contains SiO$_2$ or Al$_2$O$_3$ as an additive.

10. An actuator according to claim 1, wherein said PZT-based ceramic has a relative density of 70 to 90%.

11. An actuator comprising an actuator element capable of bending in response to an applied electric field, said actuator element consisting of a monomorph-type piezoelectric ceramic element, and a fired Ag layer on at least one side of said ceramic element, and wherein said ceramic element consists essentially of an unpolarized BaTiO$_3$-based ceramic material that exhibits a dielectric loss value of at least 5% at 1 kHz, and a dielectric loss value at 100 KHz which is at least 30% less than the dielectric loss value at 1 kHz, wherein said ceramic material contains, as an additive, between 0.2 to 20 mol% SiO$_2$, between 0.2 to 1.5 mol% Al$_2$O$_3$, or mixtures thereof, provided that if a mixture of SiO$_2$ and Al$_2$O$_3$ is present, then said mixture of SiO$_2$ and Al$_2$O$_3$ is present in an amount between 0.2 to 20 mol%, with a molar ratio of Al$_2$O$_3$ to SiO$_2$ being no greater than 0.8.

12. An actuator according to claim 11, wherein the BaTiO$_3$-based ceramic element also contains at least one oxide of a 5A-group element, Ga, Bi, Sb, W, or a rare-earth element.

* * * * *